United States Patent [19]
Temes et al.

[11] Patent Number: 5,689,201
[45] Date of Patent: Nov. 18, 1997

[54] TRACK-AND-HOLD CIRCUIT UTILIZING A NEGATIVE OF THE INPUT SIGNAL FOR TRACKING

[75] Inventors: Gabor Charles Temes; Yunteng Huang, both of Corvallis, Oreg.; Paul Francis Ferguson, Jr., Dracut, Mass.

[73] Assignee: Oregon State University, Corvallis, Oreg.

[21] Appl. No.: 512,318

[22] Filed: Aug. 8, 1995

[51] Int. Cl.[6] .................................................. G11C 27/02
[52] U.S. Cl. .............................................. 327/95; 327/96
[58] Field of Search ................................... 327/91, 94, 95, 327/96, 97, 52, 65, 90, 89, 337, 554; 330/9

[56] References Cited

U.S. PATENT DOCUMENTS

| | | | |
|---|---|---|---|
| 4,331,894 | 5/1982 | Gregorian et al. | 327/95 |
| 4,779,012 | 10/1988 | Moscovici | 327/95 |
| 4,894,620 | 1/1990 | Nagaraj | 327/337 |
| 4,988,900 | 1/1991 | Fensch | 327/337 |
| 5,121,119 | 6/1992 | Higuchi et al. | 341/120 |
| 5,124,576 | 6/1992 | Jensen | 327/94 |
| 5,130,572 | 7/1992 | Stitt | 327/96 |
| 5,180,932 | 1/1993 | Bengel | 327/362 |
| 5,206,543 | 4/1993 | Takita et al. | 327/91 |
| 5,225,776 | 7/1993 | Dobos et al. | 324/121 R |
| 5,241,494 | 8/1993 | Blyth et al. | 365/45 |
| 5,258,664 | 11/1993 | White | 327/91 |
| 5,272,480 | 12/1993 | Lee | 341/133 |
| 5,291,074 | 3/1994 | Nayebi | 327/96 |
| 5,298,801 | 3/1994 | Vorenkamp et al. | 327/91 |
| 5,311,085 | 5/1994 | Pelgrom et al. | 327/65 |
| 5,315,070 | 5/1994 | Maiwald | 174/250 |
| 5,381,053 | 1/1995 | Yasuda | 327/91 |
| 5,391,936 | 2/1995 | Soh | 327/94 |
| 5,473,275 | 12/1995 | Hughes et al. | 327/337 |
| 5,479,130 | 12/1995 | McCartney | 327/337 |
| 5,498,986 | 3/1996 | Manlove | 327/337 |
| 5,506,526 | 4/1996 | Seesink | 327/95 |
| 5,532,624 | 7/1996 | Khoury | 327/96 |
| 5,534,802 | 7/1996 | Razavi | 327/96 |
| 5,570,048 | 10/1996 | Rijns | 327/96 |

OTHER PUBLICATIONS

*Spike–Free Switched–Capacitor Circuits*, H. Matsumoto et al., Electronics Letters, vol. 23, No. 8, p. 428–429, Apr. 9, 1987.

*A Fully Differential Sample–and–Hold Circuit for High–Speed Applications*, Germano Nicollini et al., IEEE Journal of Solid–State Circuits, vol. 24, No. 5, p. 1461–1465, Oct., 1989.

*A Fast Offset–Free Sample–and–Hold Circuit*, Fong–Jim Wang et al., IEEE Journal of Solid–State Circuits, vol. 23, No. 5, p. 1270–1272, Oct., 1988.

*CMOS Video Filters Using Switched Capacitor 14–MHz Circuits*, Kazuyuki Matsui et al., IEEE Journal of Solid–State Circuits, vol. SC–20, No. 6, p. 1096–1102, Dec., 1985.

*Primary Examiner*—Timothy P. Callahan
*Assistant Examiner*—My-Trang Nu Ton
*Attorney, Agent, or Firm*—Klarquist Sparkman Campbell Leigh & Whinston, LLP

[57] ABSTRACT

A track-and-hold circuit that utilizes the negative of the input signal to improve tracking of the input signal during the track mode. By applying the negative of the input signal to an amplifier node to which the output signal is coupled, the output signal is forced to track the input signal in magnitude and polarity. Single-ended and fully differential embodiments of the circuit are disclosed, as well as embodiments using an operational amplifier and a cascode inverter amplifier. An improved switching scheme reduces delay in the transition from the hold mode to the track mode. A sample-and-hold circuit may be constructed from a pair of the track-and-hold circuits.

18 Claims, 6 Drawing Sheets

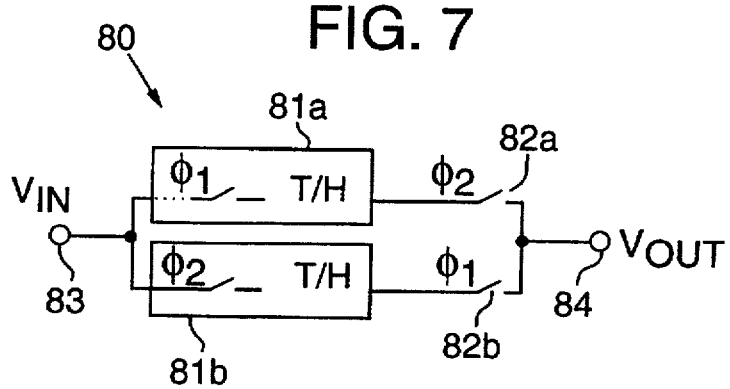
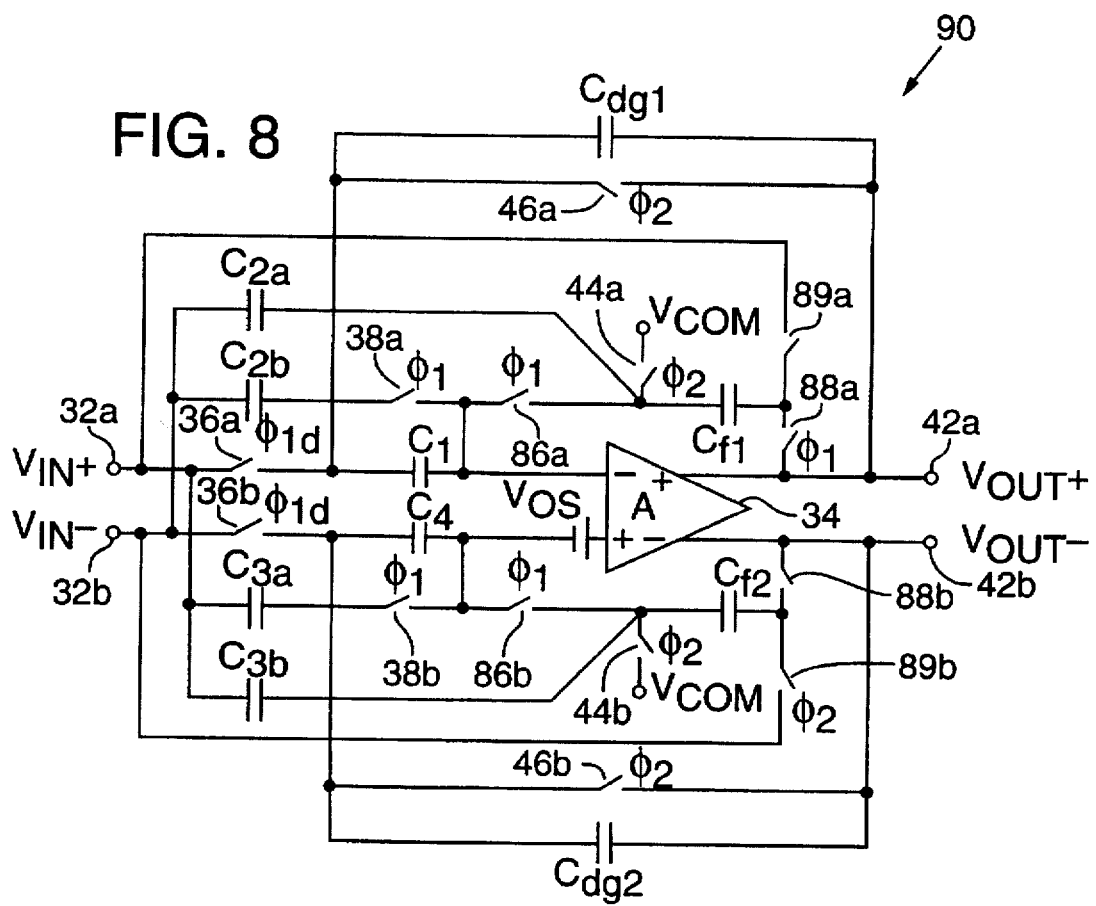

TRACK-AND-HOLD CIRCUIT UTILIZING A NEGATIVE OF THE INPUT SIGNAL FOR TRACKING

1. Field of the Invention

This invention relates generally to signal sampling circuits such as sample-and-hold and track-and-hold circuits. More particularly, this invention relates to a track-and-hold circuit that utilizes the circuit input signal as well as its negative to produce a circuit output signal that better tracks the input signal during the track mode of operation and hence better holds the input signal value during the hold mode of operation by cancelling non-ideal effects.

2. Background of the Invention

A track-and-hold circuit is designed to track an analog input signal and at specified intervals to hold at its output the instantaneous value of the input signal. This circuit is particularly useful as a first stage of an analog-to-digital converter. The held values of the input signal are provided as signal samples to a following stage of the converter, which converts them to an equivalent digital signal.

Sample-and-hold circuits provide a series of continuous held samples, one immediately after the other without gaps. A sample-and-hold circuit may be constructed from a pair of track-and hold circuits. The track mode of one track-and-hold circuit substantially coincides with the hold mode of the other circuit and the track mode of the other track-and-hold circuit substantially coincides with the hold mode of the one circuit. Switches at the output of the sample-and-hold circuit then switch between the track-and-hold circuits to select the one entering its hold mode.

Prior track-and-hold circuits suffer from the inability to accurately track the analog signal during the track mode of circuit operation. Typically the circuit output signal diverges from the input signal during this mode. When the circuit enters the hold mode of operation, the output signal must then "catch up" with the input signal before they match. The delay caused by this need to catch up limits the sampling rate and accuracy of the circuit, thereby limiting the ability of the associated stages of an analog-to-digital converter to accurately convert higher frequency signals to digital form. The absence of accurate tracking also increases the sensitivity of the circuit to a finite amplifier gain if the sampling rate is near the Nyquist rate since the voltage acquired by storage capacitors is inaccurate. FIG. 1A, for example, shows a typical prior art track-and-hold circuit. Its waveforms are shown in FIG. 1B, with the input signal represented by a solid line and the output signal represented by a dashed line. Note how the output signal diverges from the input signal during the track mode, as indicated by the arrows, and thus how much the output signal must jump in voltage to catch up with the input signal during the hold mode. The circuit's ability to change the output voltage rapidly is limited by the slew rate of the circuit's operational amplifier.

An objective of the invention, therefore, is to provide a faster and more accurate track-and-hold circuit for high-performance use, such as in telecommunications and video-frequency applications. Another objective of the invention is to provide a track-and-hold circuit that works with slower and lower gain amplifiers.

SUMMARY OF THE INVENTION

A track-and-hold circuit according to the invention includes an amplifier and means for applying a negative of the input signal to the amplifier to produce an output signal that more accurately tracks the input signal during the track mode of operation. The circuit also includes a storage device for storing the input signal during the track mode. Means within the circuit then provide the stored input signal as the output signal during the hold mode of operation, thereby producing an output signal that holds its value as the input signal may continue to vary.

The applying means may be implemented in a number of ways. In one embodiment, a single-ended version of the track-and-hold circuit includes an analog signal inverter as the applying means. The inverter provides a signal of opposite polarity and some proportion of the magnitude of the input signal. An operational amplifier configured as an inverting amplifier may be used in conjunction with the inverter to force the output signal to track the input signal. In another embodiment of the invention, the applying means in a fully differential track-and-hold circuit includes a pair of input terminals for receiving a differential input signal that provides a positive input signal and its negative. This embodiment may also include an operational amplifier configured as an inverting amplifier to force the output signal to track the input signal. A third embodiment of the invention uses a cascode inverter as the amplifier. Using the teaching of this patent, other embodiments may also be developed as desired.

A sample-and-hold circuit according to the invention may be constructed from a pair of track-and-hold circuits. The track mode of a first track-and-hold circuit substantially coincides with the hold mode of a second track-and-hold circuit and the hold mode of the first track-and-hold circuit substantially coincides with the track mode of the second. One or more switches may be configured to switch between the track-and-hold circuits to couple the circuit in the hold mode to an output terminal of the sample-and-hold circuit. The sample-and-hold circuit thus provides a continuous series of held samples without gaps at twice the sampling rate of a single track-and-hold circuit.

In a preferred embodiment of the track-and-hold circuit that includes an operational amplifier, a number of signal paths are established for the desired signal flow. First and second signal paths combine the input signal and its negative at an input node of the amplifier during the track mode. A third signal path then couples the input node to an output node of the amplifier during the track mode to produce an output signal that tracks the input signal. A storage device is provided for storing the instantaneous value of the input signal during the hold mode. A fourth signal path then couples the storage device to the output node of the amplifier during the hold mode to provide the stored input signal as the held output signal.

In another embodiment that uses an operational amplifier, a negative of the input signal may be applied to an input node of the amplifier through a first signal path. A second signal path connects the input node to an output node of the amplifier in a unity gain configuration. This also produces an output signal that tracks the input signal during the track mode.

Speed and accuracy of the track-and-hold circuit may be improved by precharging storage devices in the circuit during the hold mode to the level of the instantaneous input signal. Then when the circuit switches from the hold mode to the track mode, the circuit need not charge the storage devices to the input signal level, and the output signal more immediately jumps to the level of the instantaneous input signal.

The foregoing and other objects, features, and advantages of the invention will become more apparent from the following detailed description of several preferred embodiments, which description refers to the following drawings.

BRIEF DESCRIPTION OF THE DRAWINGS

FIG. 7 is a diagram of a sample-and-hold circuit comprised of track-and-hold circuits according to the invention.

FIG. 8 is a diagram of a fully differential embodiment of a track and hold circuit with an improved switching scheme according to the invention.

DETAILED DESCRIPTION OF PREFERRED EMBODIMENTS

Figure 1A:
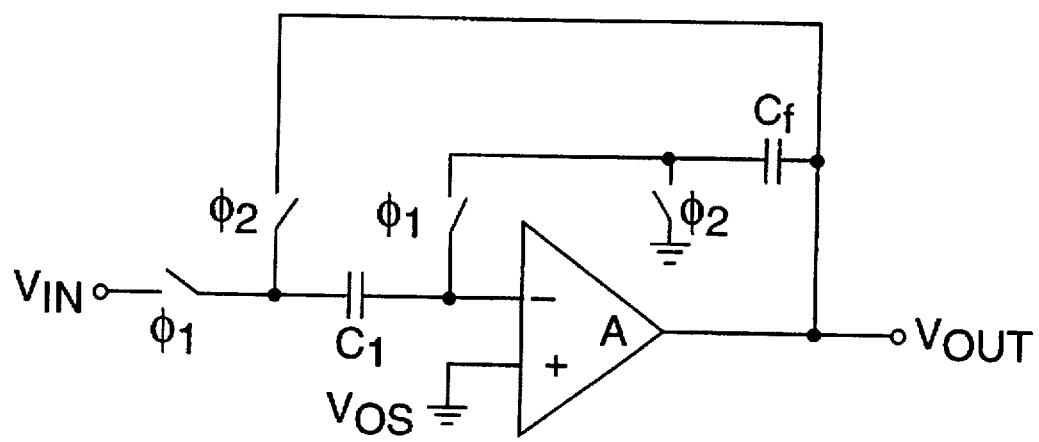
FIG. 1A is a diagram of a prior art track-and-hold circuit.
Figure 1B:
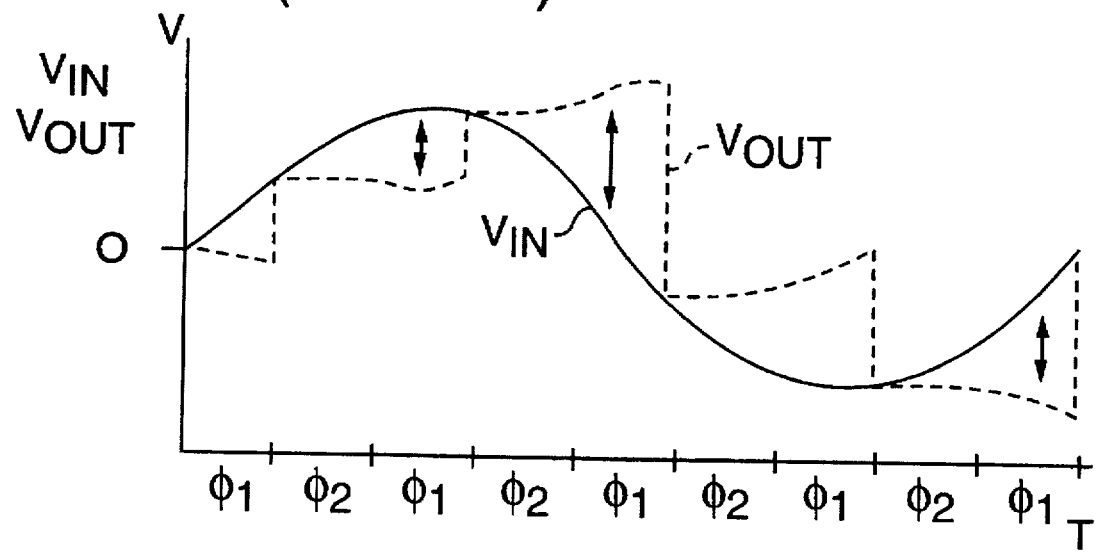
FIG. 1B shows the waveforms of the input and output signals of the prior art circuit of FIG. 1A.
Figure 2A:
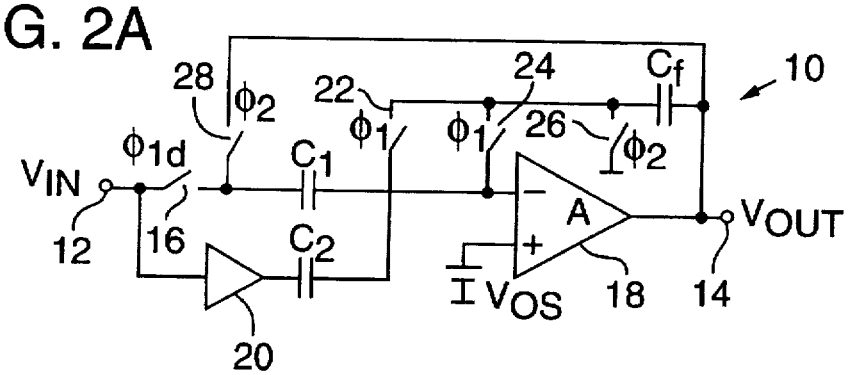
FIG. 2A is a diagram of a single-ended embodiment of a track-and-hold circuit according to the invention.

FIG. 2A is a diagram of a single-ended embodiment of a track-and-hold circuit 10 according to the invention. Circuit 10, along with the other circuit embodiments described herein, may be included as a front-end stage of an analog-to-digital converter. Circuit 10 operates in two mutually exclusive modes of operation: a track mode during which its output signal, $v_{out}$, tracks its input signal, $v_{in}$, and a hold mode during which $v_{out}$ holds as its value the instantaneous value of $v_{in}$ at the time instant the track mode ends. As shown in FIG. 2A, these modes are determined by the clock signals $\phi_1$, $\phi_{1d}$ and $\phi_2$ operating to open and close associated switches within the circuit. These clock signals may be generated by a conventional clock generator circuit or equivalent device (not shown).

The individual elements of circuit 10 and how they work together may be understood from the following description with reference to FIG. 2A. Circuit 10 includes an input terminal 12 for receiving an analog input signal $v_{in}$ and an output terminal 14 for providing an output signal $v_{out}$. A first signal path couples input terminal 12 through a switch 16 and capacitor $C_1$ to the inverting input node of an operational amplifier 18. A second signal path couples input terminal 12 through an analog inverter 20, capacitor $C_2$ and switches 22 and 24 to the inverting input node. Capacitor $C_2$ preferably has twice the capacitance of capacitor $C_1$. A third signal path couples the inverting input node of the operational amplifier through switch 24 and a capacitor $C_f$ to the output of operational amplifier 18 and adjacent output terminal 14. Capacitor $C_f$ preferably has the same capacitance as capacitor $C_1$. Connected to the third signal path between switch 24 and capacitor $C_f$ is a switch 26 to ground. A fourth signal path couples capacitor $C_1$ through a switch 28 to the output of operational amplifier 18 and adjacent output terminal 14. The noninverting input of operational amplifier 18 is connected to ground, but is shown connected to a voltage source $V_{os}$. This connection indicates that amplifier 18, like all operational amplifiers, has an inherent offset voltage $V_{os}$ that must be taken into account as a part of the circuit operation.

In operation, circuit 10 enters the track mode of operation when $\phi_1$ and $\phi_{1d}$ go high, closing switches 16, 22 and 24. Input signal $v_{in}$ is sampled on capacitor $C_1$ using the delayed-cutoff clock signal $\phi_{1d}$ to reduce the signal-dependent clock feedthrough noise. The closing of switches 16, 22 and 24 configures operational amplifier 18 as an inverting amplifier during the track mode. As such, amplifier 18 causes the current generated by $v_{in}$ and capacitor $C_1$ in the first signal path to be combined with the current generated by the $v_{in}$ and capacitor $C_2$ in the second signal path to produce a current in the third signal path. This is shown analytically by the following frequency domain equations for the currents entering the amplifier's inverting node:

$$v_{in}(s)sC_1 - v_{in}(s)sC_2 + v_{out}(s)sC_f = 0 \qquad (1)$$

With $C_2 = 2C_1$ and $C_f = C_1$, then $$v_{out}(s) = sC_1/sC_1 v_{in}(s) = v_{in}(s) \qquad (2)$$

Because $-v_{in}$ is the negative of $v_{in}$ and capacitor $C_2$ is twice the capacitance of capacitors $C_1$ and $C_f$, the current in the second signal path is large enough to force the currents in the first and third signal paths to be equal in magnitude and to flow into the inverting node. With capacitor $C_1$ equal to capacitor $C_f$, this forces $v_{out}$ to accurately track $v_{in}$ with the same polarity and magnitude during the track mode.

It will be understood by those of skill in the art that the elements shown in FIG. 2A may be implemented with any number of different physical devices so long as the devices provide the functions described above. And the characteristics of these devices may be varied so long as they cause $v_{out}$ to track $v_{in}$ in the manner described. For example, analog signal inverter 20 may be produce a voltage that is a fraction or multiple of the value of $v_{in}$, and the term "negative" is intended to include any magnitude with an opposite polarity, possibly including also a dc bias. Capacitor $C_2$ is then chosen accordingly so that the current in the second signal is twice the current and of opposite polarity to the currents in the first and third signal paths. The capacitors, of course, may be replaced by any storage device that provides the desired signal storage. Operational amplifier 18 may be any device that provides the required amplification. Switches 16, 22, 24, 26 and 28 may be pass transistors or other electronic switches that open and close in response to signals $\phi_1$, $\phi_{1d}$, and $\phi_2$.

Figure 2B:
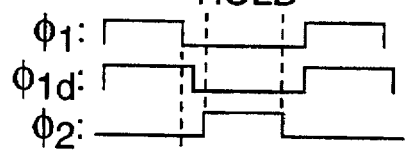
FIG. 2B is a timing diagram for the clock signals of the circuit of FIG. 2A.

As shown in FIG. 2B, circuit 10 leaves the track mode and enters the hold mode after clock signals $\phi_1$, $\phi_{1d}$ go low and $\phi_2$ goes high. As the hold interval begins, capacitor $C_1$ has been precharged to a voltage $$v_{c1} = v_{in} - V_{os} + v_{in}/A \qquad (3)$$

with $V_{os}$ being the input-referred offset voltage inherent in operational amplifier 18 and A being its dc gain.

When $\phi_2$ goes high, the left-side terminal of capacitor $C_1$ is switched to the output node of amplifier 18 and adjacent terminal 14. The output voltage $v_{out}$ then becomes $$v_{out} = V_{os} - v_{out}/A + v_{c1} = v_{in}(1 + 1/A) - v_{out}/A \qquad (4)$$

$$v_{out}(1 + 1/A) = v_{in}(1 + 1/A) \qquad (5)$$

This gives $v_{out} = v_{in}$, with cancellation of the effects of finite gain A and the nonzero offset $v_{out}$ of operational amplifier 18. The held value of $v_{out}$ is thus identical to the input signal $v_{in}$ sampled at the time instant when clock signal $\phi_{1d}$ went low.

The circuit operation described above does not depend on having a high oversampling ratio, and hence circuit 10 is inherently suitable for high-frequency applications. However, the derivation above assumes that $v_{out}=v_{in}$ holds exactly during the track mode. In fact, offset voltage $V_{os}$ and gain A do affect the ability of $v_{out}$ to track $v_{in}$. Assuming $C_1=C_f=C_2/2=C$ and taking $V_{os}$ and A into account, the z-transform of the T/H output when $\phi_2=1$ is then found to be $$v_{out}^{(2)}(z) = \frac{1}{1+(4+z^{-1})/[A(A+5)]} v_{in}(z) + \frac{V_{os}(1-z^{-1})}{A+5+(4+z^{-1})/A} \quad (6)$$

When A>>5, $V_{out}^{(2)}$ can be approximated by $$v_{out}^{(2)}(z) \approx \frac{v_{in}(z)}{1+(4+z^{-1})/A^2} + \frac{V_{os}/A}{1-z^{-1}} \quad (7)$$

Thus, the error terms due to the finite gain and the nonzero offset are both reduced by a factor 1/A. The mismatch between the capacitors which are nominally equal to C and 2C also affects the compensation. However, this effect is usually negligible, since it only appears during the track mode, and hence the error which it causes in the held signal is second-order small. Unlike in prior track and hold circuits, the error in the output given in Eq. (7) changes only slightly with frequency, so the speed limitation of the circuit 10 is mainly due to the settling time of the operational amplifier. To maximize the speed, it may be desirable to tune the operational amplifier compensation to the operation mode (track or hold).

Figure 3A:
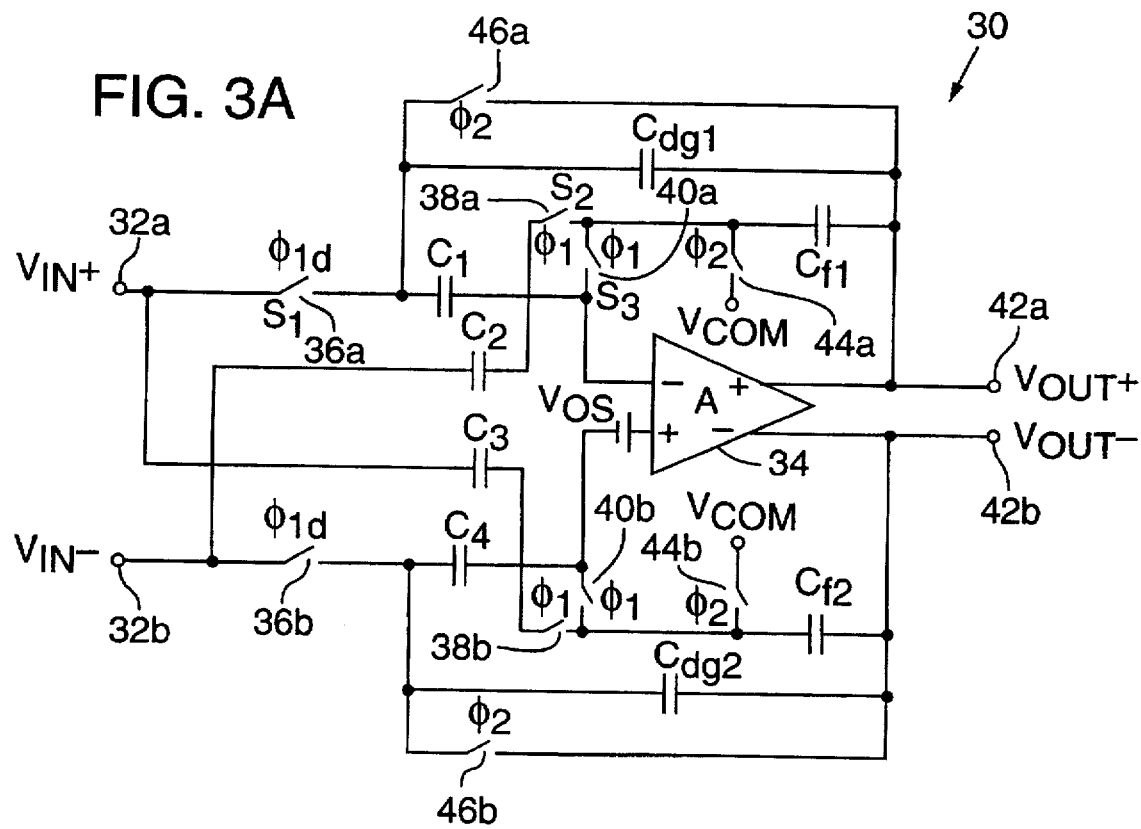
FIG. 3A is a diagram of a fully differential embodiment of a track-and-hold circuit according to the invention.
Figure 3B:
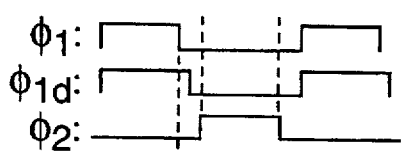
FIG. 3B is a timing diagram for the clock signals of the circuit of FIG. 3A.

The track-and-hold circuit 10 of FIG. 2A may be extended to fully differential operation as shown in the circuit 30 of FIG. 3A. The analog inverter 20 is no longer needed, since the negative of the differential signal, $v_{in}-$, is received at a second input terminal 32b. The positive of the differential signal, $v_{in}+$, is received at a first input terminal 32a. At the inverting node of operation amplifier 34, three signal paths join as before. The first signal path couples input terminal 32a through a switch 36a and a capacitor $C_1$ to the inverting input node. A second signal path couples input terminal 32b through a capacitor $C_2$ and switches 38a and 40a to the inverting input node. A third signal path couples the inverting output node of operational amplifier 34 and adjacent output terminal 42a through a capacitor $C_{f1}$ and switch 40a to the inverting input node. Connected to the third signal path between switch 40a and capacitor $C_{f1}$ is a switch 44a to the common-mode input voltage, $V_{comm}$, of operational amplifier 34. A fourth signal path couples capacitor $C_1$ through a switch 46a to the noninverting output node of operational amplifier 34. A fifth signal path couples the noninverting output node of operational amplifier 34 through a deglitching capacitor $C_{dg1}$ to capacitor $C_1$. Capacitor $C_{dg1}$ provides feedback for operational amplifier 34 during the time interval when the non-overlapping clock phases for $\phi_1$ and $\phi_2$ are both low (see FIG. 3B). This feedback reduces the sharp voltage spikes ("glitches") that would otherwise be generated during this interval. Five signal paths symmetrical to those described above are also established with respect to input terminal 32b and output terminal 42b through corresponding switches 36b–46b and capacitors $C_4$, $C_3$, $C_{f2}$, and $C_{dg2}$. Circuit 30 thus produces a fully differential output signal $v_{out+}$ and $v_{out-}$.

The operation of circuit 30 in tracking and holding the input signal is similar to the operation of circuit 10 described above, except for the use of differential signals. The common mode voltage $V_{comm}$ is used instead of ground to provide the dc bias for the operational amplifier. And since switches 36a, 36b are opened by $\phi_{1d}$ later than the switches responsive to $\phi_1$, the clock-feedthrough noise becomes nearly signal-independent and is thus suppressed by the common-mode rejection of operational amplifier 34.

Figure 4:
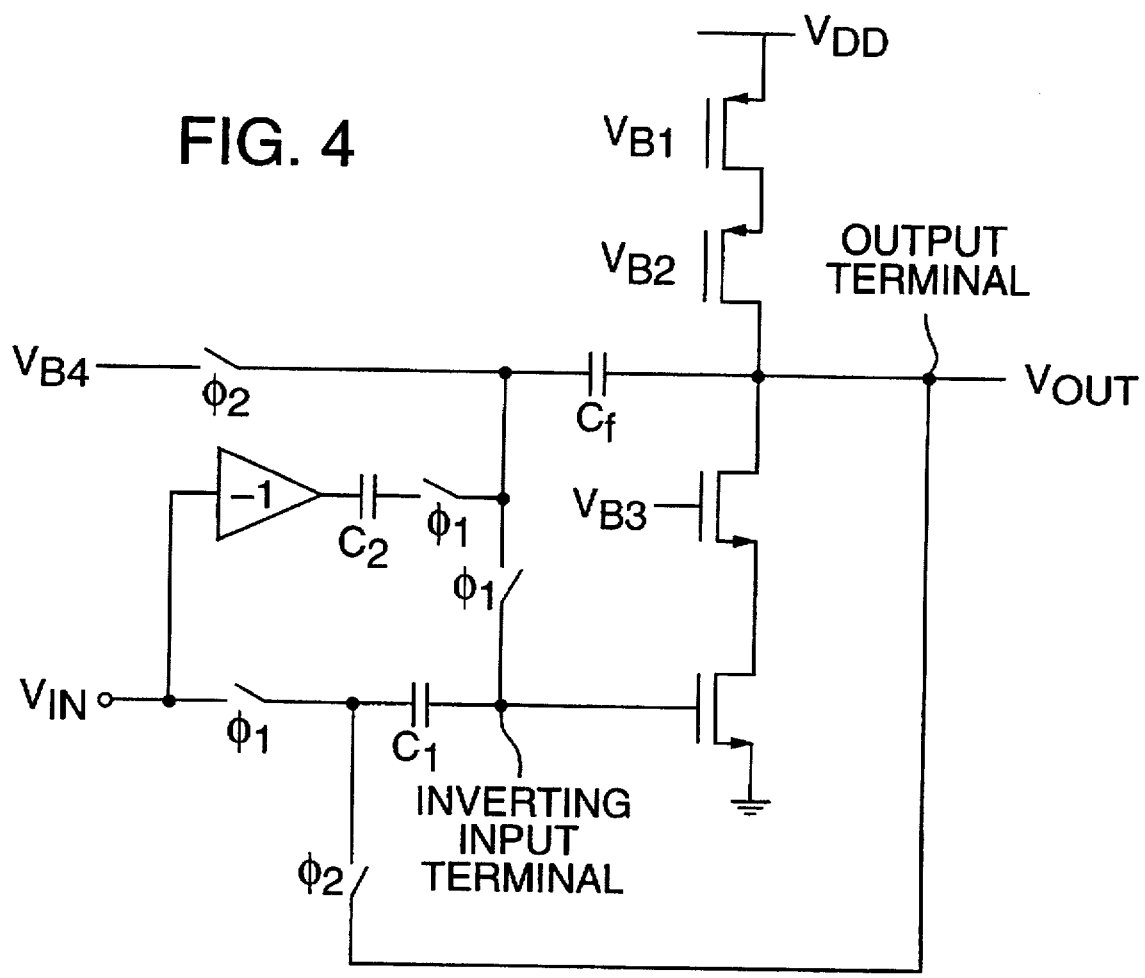
FIG. 4 is a diagram of a cascode inverter embodiment of a track-and-hold circuit according to the invention.

FIG. 4 is a diagram of a cascode inverter embodiment of a track-and-hold circuit according to the invention. Here, the four series transistors form a simple equivalent of the operational amplifier described with respect to FIGS. 2A–4. The bias voltages VB1–VB4 are used to keep all four transistors in their high-gain operational regions.

Figure 5:
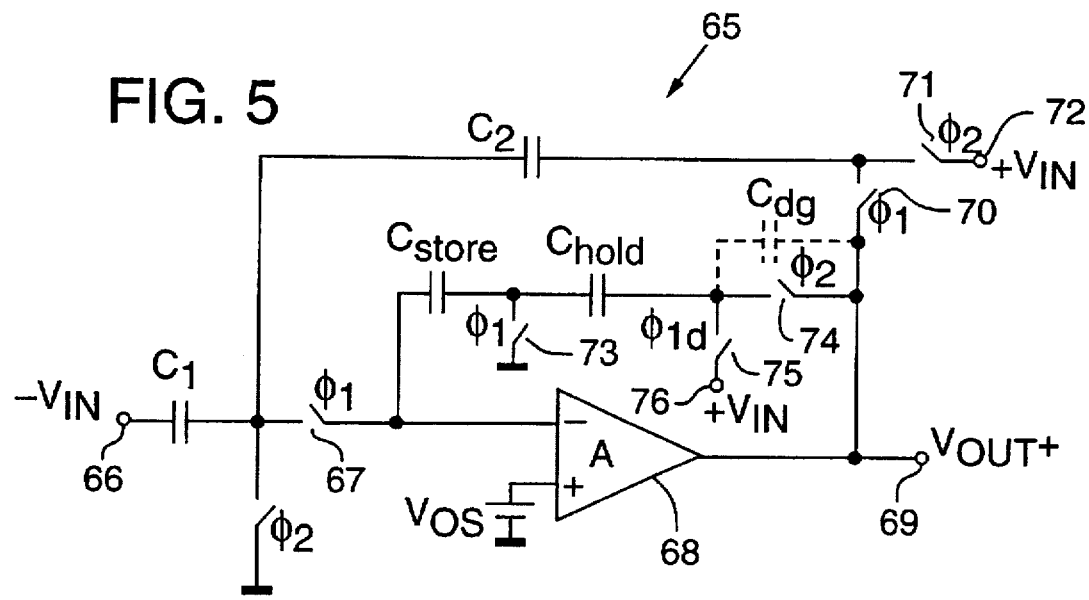
FIG. 5 is a diagram of another singled-ended embodiment of a track-and-hold circuit according to the invention.

FIG. 5 shows yet another embodiment of a single-ended track-and-hold circuit 65 according to the invention. During the track mode, four signal paths are established. A first signal path couples an input terminal 66 and $-v_{in}$ through a capacitor $C_1$ and switch 67 to the inverting input node of an operational amplifier 68. A second path couples the output node of the amplifier and adjacent output terminal 69 through a switch 70, a capacitor $C_2$ and switch 67 to the inverting input node. A third signal path couples the inverting input node of amplifier 68 to ground through a capacitor $C_{store}$ and a switch 73. And a fourth signal path couples an input terminal 76 for +vin through a switch 75, a capacitor $C_{hold}$ and switch 73 to ground.

During the hold mode, several other paths are established. A fifth signal path couples the inverting input node of the operational amplifier through capacitors $C_{store}$ and $C_{hold}$ and a switch 74 to output terminal 69. A sixth signal path couples an input terminal 71 for +vin through capacitor C2 to ground. And a seventh signal path couples input terminal 66 and −vin through capacitor C1 to ground.

During the track mode while clock signals $\phi_1$, $\phi_{1d}$ are high, capacitors $C_1$, $C_2$ and amplifier 68 form a unity gain amplifier satisfying the relation $$-v_{in}(s)sC_1+v_{out}(s)sC_2=0 \quad (8)$$

With $C_1=C_2$, $v_{in}=v_{out}$ and $v_{out}$ thus track $v_{in}$. Also during the track mode, $C_{store}$ stores the effective offset voltage $V_{os}$ $-v_{out}/A$ and $C_{hold}$ stores $+v_{in}$.

When circuit 65 enters its hold mode and $\phi_2$ goes high, $C_{hold}$ provides the stored $+v_{in}$ as $v_{out}$ while the series-connected capacitor $C_{store}$ cancels the effective offset voltage of operational amplifier 68. Capacitors $C_1$ and $C_2$ are precharged during the hold mode to $-v_{in}$ and $+v_{in}$, respectively. This precharging reduces the slew rate requirements for operational amplifier 68 when the circuit switches back to the track mode. This in turn reduces the power consumption of the operational amplifier.

Circuit 65 has several advantages over the other embodiments described above. If all of the capacitors are of the same capacitance, then the feedback coefficient of operational amplifier is 2 rather than 3. The capacitive loading during tracking is therefore less, which allows greater circuit speed. Since $C_{hold}$ samples the input signal $+v_{in}$ with reference to true ground, its charge tends to be less affected by any nonlinearities of switches 73, 74 and 75. And the capacitor matching requirements can be more relaxed.

Figure 6:
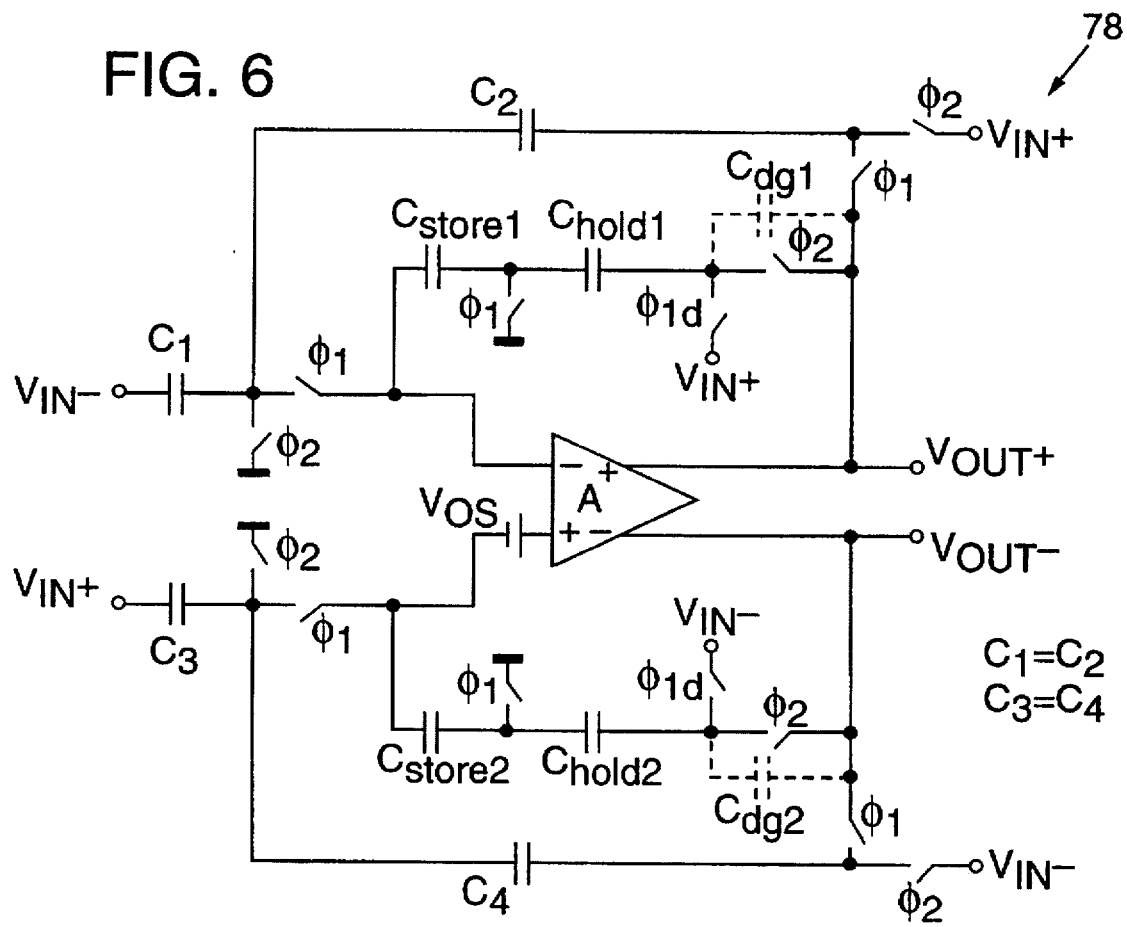
FIG. 6 is a diagram of a fully differential version of the track-and-hold circuit of FIG. 5.

FIG. 6 shows how the principles of circuit 65 may be extended to a fully differential track-and-hold circuit 78.

FIG. 7 shows a sample-and-hold circuit 80 constructed from a pair of track-and-hold circuits 81a and 81b such as circuits 10, 30, 50, 65, 78 or 90 (FIG. 8). Both circuits 81a, 81b are coupled to an input terminal 83 that receives $v_{in}$ in what is known as a ping-pong approach. Circuits 81a and 81b are operated in alternate modes, with the track mode of circuit 81a substantially coinciding with the hold mode of circuit 81b and the hold mode of circuit 81a substantially coinciding with the track mode of circuit 81b. A pair of toggling switches 82a and 82b alternately couple circuits 81a, 81b to an output terminal 84. Circuit 81a is coupled to output terminal 84 through switch 82a while the circuit is in its hold mode. When circuit 81a switches to its track mode, switch 82b couples circuit 81b, which has entered its hold mode, to output terminal 84. The output voltage $V_{out}$ at terminal 84 thus contains only a series of held values of the input signal. An added benefit is the doubling of the sampling rate since $V_{out}$ is updated twice as often using the two track-and-hold circuit in tandem.

Again, it should be understood that a sample-and-hold circuit according to the invention is not limited to the implementation of FIG. 7. Switches 82a, 82b may be configured in any number of ways to produce the desired toggling or may be combined into a single switch if desired. It is also possible to connect the two track-and-hold circuits in cascade to obtain a sample-and-hold circuit.

FIG. 8 shows a version of a fully differential track-and-hold circuit 90 that includes an improved switching scheme. Speed and accuracy of a track-and-hold circuit is achieved by precharging all capacitors during the hold mode. To do so, capacitors $C_2$ and $C_3$ in circuit 30 are respectively split into two equal-value capacitors $C_{2a}$, $C_{2b}$ and $C_{3a}$, $C_{3b}$, which now equal the capacitance of capacitors $C_1$, $C_4$, $C_{f1}$ and $C_{f2}$. Several changes and additions are also made to the signal paths. The second signal path no longer contains switch 40a. The third signal path, on the other hand, now contains switches 86a and 88a. A sixth signal path is established from input terminal 32a through capacitor $C_{3b}$ to capacitor $C_{f2}$. A seventh signal path is established between input terminal 32a through a switch 89a to capacitor $C_{f1}$. Symmetrical changes and additional paths are added to the other half of circuit 90.

Recall in FIG. 3A that when $\phi_1$ and $\phi_{1d}$ go high and the track-and-hold circuit 30 switches to the track mode, capacitor $C_1$ sends a charge $q_1 = C_1[v_{in}(n) - v_{in}(n-1)]$ into the inverting input node of amplifier 34. Capacitor $C_2$ sends twice that charge, causing the voltage at the output terminal to jump from the held value to the present value of $v_{in}$. The jump, however, is not instantaneous and is delayed by the slew rate and settling time of operational amplifier 34.

The circuit 90 of FIG. 8 greatly reduces the delay by storing the present value of $v_{in}$ during the hold mode and then providing that value as $v_{out}$ at the beginning of the track mode. This is accomplished by balancing the charge from capacitor $C_1$ by an equal but opposite charge through capacitor $C_{2b}$. Capacitor $C_{f1}$ is also precharged during the hold mode to the present input voltage via switch 89a. Thus, unlike in circuit 30, capacitor $C_{f1}$ does not need to be charged by operational amplifier 34 to achieve $v_{out}(n) = v_{in}(n)$ when $\phi_1$ goes high.

Figure 9A:
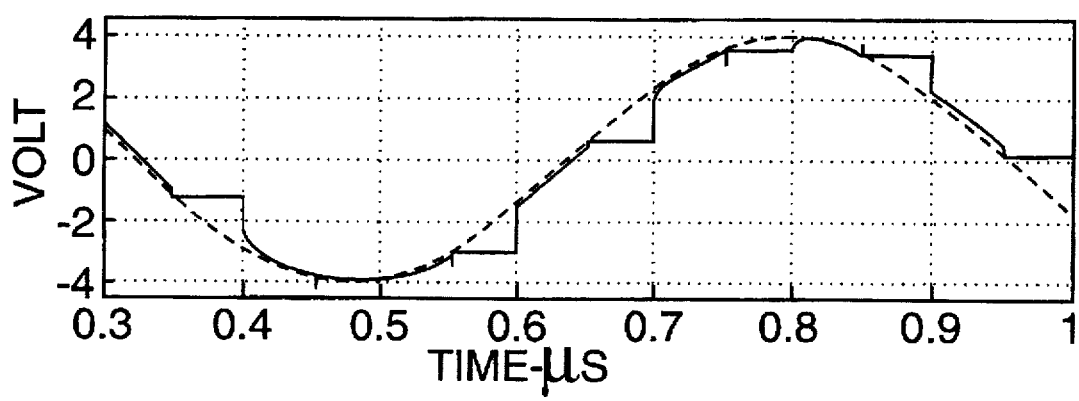
FIGS. 9A–C show the waveforms of the input and output signals at several nodes in the circuit of FIG. 7.
Figure 9B:
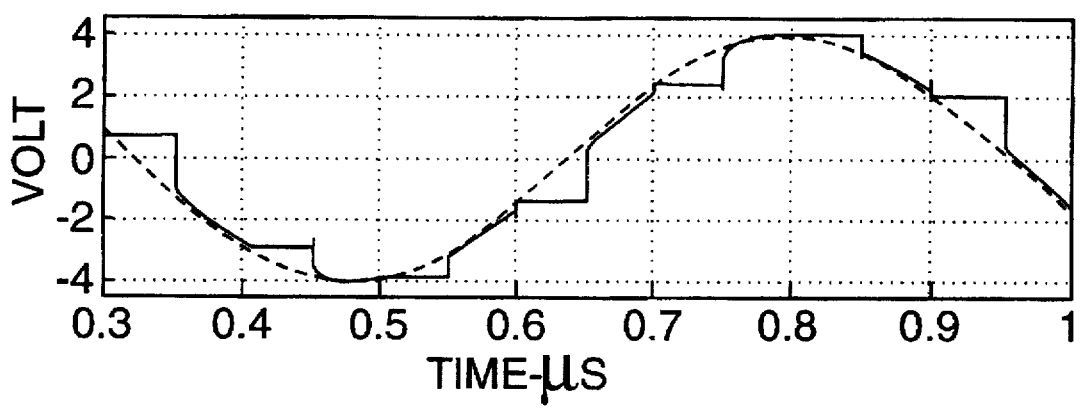
Figure 9C:
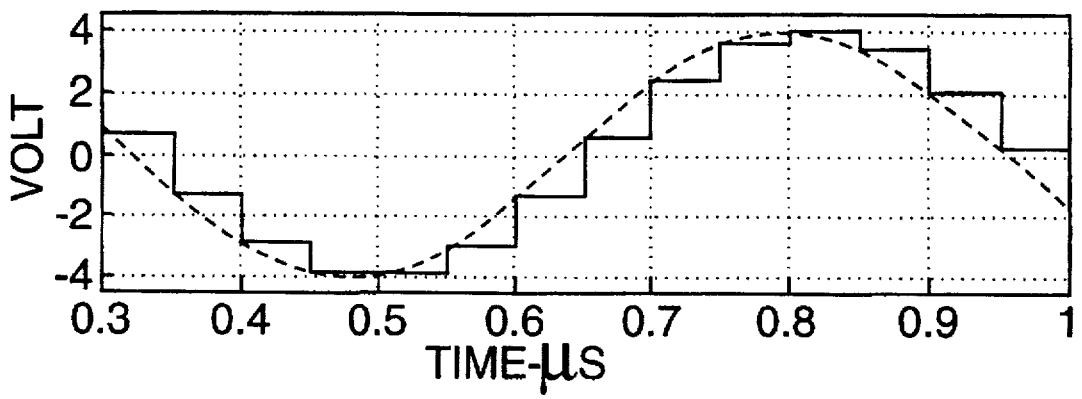

HSPICE computer-simulated time responses of the sample-and-hold circuit 80 (FIG. 7) using a pair of circuits 90 with an operational transconductance amplifier (OTA) behavioral macro model and MOS switches modelled for MOSIS 1.0 micron process are shown in FIGS. 9A–C. The signal frequency is 1.57 MHz and the effective sampling frequency is 20 MHz. The parameters assumed are asymmetric: an OTA gain=60 dB, $V_{os}$=5 mV, Gm=1 mA/V for circuit 8/a and an OTA gain=58 dB, $V_{os}$=-5 mV, Gm=1.01 mA/V for circuit 81b. FIG. 9A shows the response at node A of the sample-and-hold circuit; FIG. 9B shows the response at node B; and FIG. 9C shows the response at the output terminal 84.

Having illustrated and described the principles of the invention in a preferred embodiment, it should be apparent to those skilled in the art that the embodiment can be modified in arrangement and detail without departing from such principles. In view of the many possible embodiments to which the principles of our invention may be applied, it should be understood that the illustrated embodiments are only preferred examples of the invention and should not be taken as limitations on the scope of the invention. Rather, the invention is defined by the following claims. We therefore claim as our invention all that comes within the scope and spirit of these claims.

We claim:

1. A track-and-hold circuit switchable between a track mode of operation wherein an output signal tracks an input signal and a hold mode of operation wherein the output signal holds its value, comprising:

an amplifier;

means for applying a negative of the input signal to the amplifier to produce an output signal that tracks the input signal during the track mode;

a storage device for storing the input signal during the track mode; and means for providing the stored input signal as the output signal during the hold mode, thereby producing an output signal that holds its value.

2. The track-and-hold circuit of claim 1 wherein the applying means includes an analog signal inverter for inverting the input signal.

3. The track-and-hold circuit of claim 1 wherein the applying means includes a pair of input terminals for receiving a differential input signal that provides a positive input signal and its negative.

4. The track-and-hold circuit of claim 1 wherein the applying means comprises an input terminal for coupling the negative of the input signal to an inverting input node of the amplifier.

5. The track-and-hold circuit of claim 1 wherein the amplifier comprises an operational amplifier configured as an inverting amplifier that produces the output signal which tracks the input signal during the track mode.

6. The track-and-hold circuit of claim 1 wherein the amplifier comprises includes a cascode amplifier configured as an inverting amplifier that produces the output signal which tracks the input signal during the track mode.

7. The track-and-hold circuit of claim 1 wherein the amplifier comprises an operational amplifier configured as a unity gain amplifier that produces the output signal that tracks the input signal during the track mode.

8. The track-and-hold circuit of claim 1 wherein the storage device comprises a capacitor that charges to a value which tracks the input signal during the track node.

9. The track-and-hold circuit of claim 1 including:

a second storage device for storing the input signal during the hold mode; and a switch for providing the stored input signal as the output signal at the beginning of the track mode.

10. A track-and-hold circuit switchable between a track mode of operation wherein an output signal tracks an input signal and a hold mode of operation wherein the output signal holds its value, comprising:

an amplifier having at least one input node and at least one output node;

first and second signal paths for combining the input signal and its negative at an input node of the amplifier during the track mode;

a third signal path connecting the input node to an output node of the amplifier during the track mode to produce an output signal that tracks the input signal;

a storage device for storing the input signal during the track mode; and a fourth signal path for coupling the storage device to the output node of the amplifier during the hold mode to provide the stored input signal as the output signal.

11. The track and hold circuit of claim 10 including:

a second storage device for storing the input signal during the hold mode; and a switch for coupling the second storage device to the output node of the amplifier to provide the stored input signal as the output signal at the beginning of the track mode.

12. The track-and-hold circuit of claim 10 including means in the first, second and third signal paths for configuring the amplifier as a non-inverting amplifier that produces the output signal which tracks the input signal.

13. The track-and-hold circuit of claim 10 wherein the first and second signal paths each include an input terminal for receiving a part of a differential signal that provides a positive input signal and its negative.

14. The track-and-hold circuit of claim 10 wherein the second signal path includes an analog signal inverter for inverting the input signal.

15. A track-and-hold circuit switchable between a track mode of operation wherein an output signal tracks an input signal and a hold mode of operation wherein the output signal holds its value, comprising:

an amplifier have at least one input node and at least one output node;

a first signal path for applying a negative of the input signal to an input node of the amplifier;

a second signal path for connecting the input node to an output node of the amplifier during the track mode to produce an output signal that tracks the input signal;

a storage device for storing the input signal during the track mode; and another signal path for coupling the storage device to the output node of the amplifier during the hold mode to provide the stored input signal as the output signal.

16. The track and hold circuit of claim 15 including:

a second storage device for storing the input signal during the hold mode; and a switch for coupling the storage device to the output node of the amplifier to provide the stored input signal as the output signal at the beginning of the track mode.

17. In a track-and-hold circuit that includes an amplifier, a method for switching between a track mode of operation wherein an output signal tracks an input signal and a hold mode of operation wherein the output signal holds its value, comprising:

applying a negative of the signal to the amplifier to produce an output signal that tracks the input signal during the track mode;

storing the input signal during the track mode; and providing the stored input signal as the output signal during the hold mode, thereby producing an output signal that holds its value.

18. The method of claim 17 including:

storing the input signal during the hold mode; and providing the stored input signal as the output signal at the beginning of the track mode to reduce delay in transition from the hold mode to the track mode.

* * * * *